(12) United States Patent
Liebeke

(10) Patent No.: US 6,834,787 B2  
(45) Date of Patent: Dec. 28, 2004

(54) FEEDING DEVICES FOR TAPED ELECTRIC COMPONENTS

(75) Inventor: Thomas Liebeke, Ottobrunn (DE)

(73) Assignee: Siemens Aktiengesellschaft, Munich (DE)

(*) Notice: Subject to any disclaimer, the term of this patent is extended or adjusted under 35 U.S.C. 154(b) by 95 days.

(21) Appl. No.: 10/258,553

(22) PCT Filed: Apr. 3, 2001

(86) PCT No.: PCT/DE01/01286  
§ 371 (c)(1),  
(2), (4) Date: Oct. 25, 2002

(87) PCT Pub. No.: WO01/82660  
PCT Pub. Date: Nov. 1, 2001

(65) Prior Publication Data  
US 2003/0127487 A1 Jul. 10, 2003

(30) Foreign Application Priority Data  
Apr. 27, 2000 (DE) .......................... 100 20 749

(51) Int. Cl.[7] .............................. B65H 20/00
(52) U.S. Cl. .................. 226/188; 226/109; 226/86; 198/834
(58) Field of Search ................. 226/188, 110, 226/109, 128, 86; 198/834

(56) References Cited

U.S. PATENT DOCUMENTS

| | | | | |
|---|---|---|---|---|
| 904,866 A | * | 11/1908 | Gridley | 29/37 R |
| 1,825,706 A | * | 10/1931 | Sherman | 462/50 |
| 2,451,045 A | * | 10/1948 | Potts | 178/17 A |
| 3,331,126 A | * | 7/1967 | Fielder et al. | 29/603.26 |
| 3,338,492 A | * | 8/1967 | Cornell, Jr. | 226/110 |
| 3,620,481 A | * | 11/1971 | Stewart et al. | 242/352 |
| 4,579,269 A | * | 4/1986 | Lasley | 226/188 |
| 5,299,902 A | * | 4/1994 | Fujiwara et al. | 414/416.01 |
| 5,725,140 A | * | 3/1998 | Weber et al. | 226/139 |
| 5,799,854 A | * | 9/1998 | Lin | 226/188 |
| 5,975,395 A | | 11/1999 | Takada et al. | |
| 6,032,845 A | * | 3/2000 | Piccone et al. | 226/139 |
| 6,162,007 A | * | 12/2000 | Witte | 414/416.01 |

FOREIGN PATENT DOCUMENTS

| | | |
|---|---|---|
| DE | 3736530 | 5/1989 |
| EP | 0589275 | 3/1994 |

OTHER PUBLICATIONS

The Siemens company publication 0 299–S–23–500–d, Issue 1, p. 12. 4 Sheets Submitted Only, no date.

* cited by examiner

Primary Examiner—Joe Dillon, Jr.  
(74) Attorney, Agent, or Firm—Harness, Dickey & Pierce, P.L.C.

(57) ABSTRACT

A feeding device for taped electric components includes advancing wheels for the tapes. The advancing wheels are driven via tangentially disposed drive spindles of a worm drive. Drive motors for the drive spindles are off-set from one another in two directions of the coordinate system in such a manner that their distance in the axial direction of the advancing wheels is smaller than the distance of the advancing wheels. This thereby allows an increase of the thickness of the drive motors and a corresponding increase of their drive power.

16 Claims, 1 Drawing Sheet

FEEDING DEVICES FOR TAPED ELECTRIC COMPONENTS

This application is the national phase under 35 U.S.C. § 371 of PCT International Application No. PCT/DE01/01286 which has an International filing date of April, 2001, which designated the United States of America and which claims priority on German Patent Application number DE 100 20 749.9 filed Apr. 27, 2000, the entire contents of which are hereby incorporated herein by reference.

FIELD OF THE INVENTION

The invention generally relates to a feeding device for electric components held in a plurality of tapes. More preferably, it relates to one where it is possible, in each case, for a belt to be driven by use of a transport wheel, which is coupled to an electric motor via a step-up gear mechanism.

BACKGROUND OF THE INVENTION

EP 0 589 275 A1 has disclosed a feeding device for taped electric components in which transport pins of the transport wheel engage in transport holes in a tape and drive the latter step by step in such a way that the components, held in pockets, pass successively to a collection position, in which they can be removed by a gripper belonging to an automatic pick and place machine for electric circuit boards. The transport wheel is operated by a drive motor via a worm gear mechanism and a spur gear mechanism. The motor axis is located on that side of the spindle axis of the worm gear which faces the tape. Since, here, the drive motor needs a complete revolution or an integer multiple of a complete revolution during each step by use of a moveable stop, a corresponding step-up ratio has to be set, which is made possible by the spur gear mechanism.

The Siemens company publication 0 299-S-23-500-d, Issue 1, page 12, also discloses a feeding device in which two narrow tapes can be handled in one feeding device. In this case, separate drive devices according to EP 589 275 A1 are used for the individual tapes. It is common to keep the thickness of the drive motors as low as possible, since two of the motors located in parallel beside each other find space within a housing of the feeding device. Doubling the component tracks has the advantage of low overall costs with only one housing which, because of its greater width, can be constructed to be particularly dimensionally stable.

On pages 2 and 3 of the aforementioned company publication, a pick and place concept is described and presented in which a turret-like pick and place head is provided with a large number of grippers that project in the manner of a star. If a large number of components of the same type are needed, then the pick and place head can be cycled onward very quickly from gripper to gripper without having to change its position. In order to be able to drag the components correspondingly quickly, the drive motor of the feeding device has to have the largest possible diameter in order to be able to provide the corresponding drive power.

SUMMARY OF THE INVENTION

An embodiment of the invention is based on an object of being able to increase the thickness of the drive motors.

As a result of the offset of the motor axes, the drive motors can overlap laterally in the axial direction of the transport wheels, so that the motor thickness and therefore the power of the motors can be increased. In particular, it is possible to increase the overall thickness of the motors to a dimension which is greater than the outer width of the feeding device. Therefore, the cycle rate in each of the tapes can be matched to an increased cycle rate of the turret head, which is reflected in a corresponding increase in the performance of the automatic pick and place machine.

A self-locking worm gear mechanism can make it possible to arrange for the motors to be switched on only during the drive phase and to be switched off outside the phase. Therefore, in spite of the increased power, the heat loading of the motors and of the feeding device can be reduced to a non-damaging level.

Further, it is possible to disentangle the drive motors in terms of their geometric arrangement in a straightforward manner.

In addition, the motors can remain oriented in a single direction, which makes installation easier. As a result of their parallelism, the entire envelope volume remains low.

Also, the number of motors and therefore the number of drive wheels and of tapes can be increased considerably, with constant external dimensions. This makes it possible, within the predefined placement width of the feeding devices, to increase the number of tracks and therefore the number of different component types.

BRIEF DESCRIPTION OF THE DRAWINGS

In the following text, the invention will be explained in more detail using exemplary embodiments that are illustrated schematically in the drawings, in which.

DETAILED DESCRIPTION OF THE PREFERRED EMBODIMENTS

Figure 1:
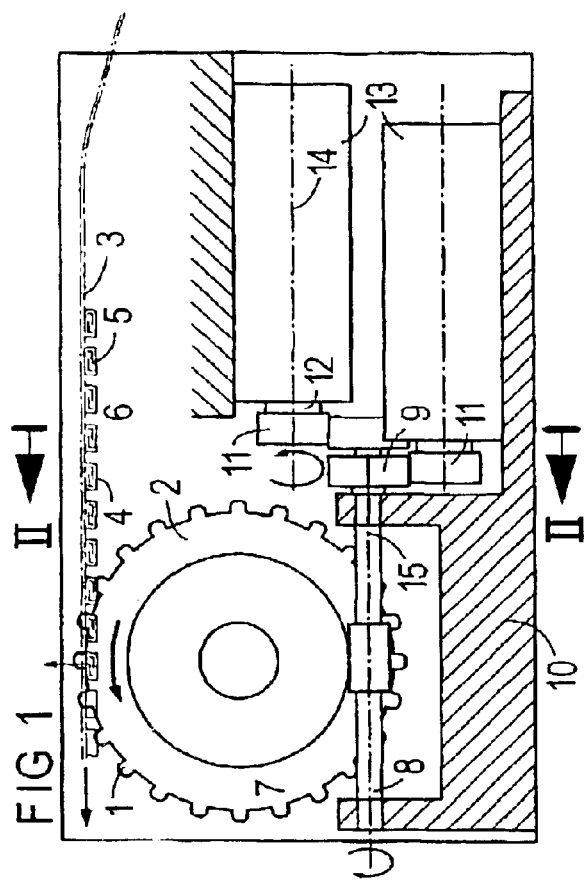
FIG. 1 shows a lateral partial section through a feeding device for taped components.
Figure 3:
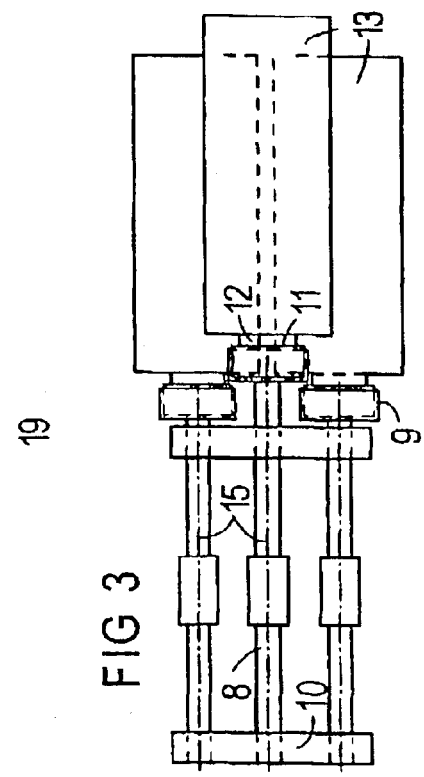
FIG. 3 shows a plan view of functional parts according to FIG. 1.
Figure 2:
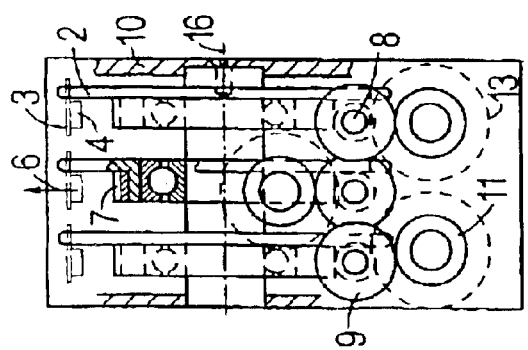
FIG. 2 shows a section along the line II—II in FIG. 1.

According to FIGS. 1, 2 and 3, tooth-like transport pins 1 belonging to a transport wheel 2 engage in transport holes in a tape 3, which is provided with pockets 4 to hold electric components 5. As a result of rotation of the transport wheel 2 about its axis of rotation 16, the electric components are transported step by step into a collection position, where, in accordance with the vertical arrow 6, they can be removed by a gripper belonging to a pick and place device for electric circuit boards.

The transport wheel 2 is driven by a worm gear mechanism, which is formed by a worm wheel 7 connected to the transport wheel 2, and a spindle 8 which is fitted tangentially and bears a gear 9 at its end. The spindle is mounted in a housing 10 of the feeding device, parallel to the transport direction of the tape 3. The gear 9 engages with a driven pinion 11 of a motor shaft 12 of an electric drive motor 13. Its motor axis 14 extends parallel to the spindle axis 15 of the drive spindle 8. The functional parts described form a drive unit for the tape 3.

In addition and parallel to the latter, a further two belts 3 are provided, which can be driven in the same way by two further, coaxially arranged transport wheels 2. These are rotated by two further drive spindles 8 which extend at right angles to the axial direction of the transport wheels 2 in a drive plane which is at right angles to the plane of rotation of the transport wheels 2. The overall thickness of the drive motors is greater than the width of the feeding device in the direction of the axis of rotation 16. However, as viewed in the plane of rotation of the transport wheels, they are offset with respect to one another in such a way that their motor axes 14 are located on both sides of the drive plane. In this direction, their spacing is greater than their thickness, so that they can overlap mutually, as viewed in the plan view of FIG. 3.

The diameter of the drive pinions 11 is greater than the pitch spacing of the drive spindles 8. However, they are offset so far from one another in their axial direction that they can overlap mutually in their front view of FIG. 2.

Figure 4:
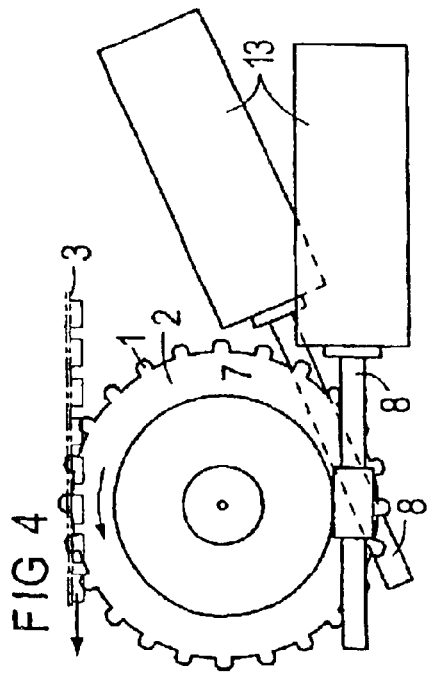
FIG. 4 shows a side view of drive parts of another feeding device similar to FIG. 1.

In the feeding device according to FIG. 4, the motor shafts 12 of the drive motors 13 are coupled directly to the drive spindles 8 and extend tangentially with respect to the worm wheel 7 of the transport wheel 2. In this case, the central of the drive motors 13 with the drive spindle 8 is arranged to be pivoted so far around the axis of rotation of the transport wheels 2 that the motor housings are located outside their overlap area. In this way, greater motor thicknesses can likewise be achieved within the side boundary of the feeding device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A feeding device adapted for taped electric components, comprising:
   a plurality of transport wheels, adapted to transport tape; and
   a plurality of drive motors, each coupled to a transport wheel via a step-up gear mechanism, wherein axes of rotation of the transport wheels are arranged coaxially and motor axes of the drive motors are oriented at right angles to the axes of rotation, and wherein a thickness of the drive motors is greater than the pitch spacings between the transport wheels, and wherein, in at least two of the drive motors, the motor axes are arranged to be offset in relation to each other in a projection at right angles to the plane of rotation of the transport wheels.

2. The feeding device as claimed in claim 1, wherein the step-up gear mechanism is constructed as a worm gear mechanism, wherein a worm wheel of the worm gear mechanism is firmly connected to the transport wheel, and wherein a drive spindle fitted tangentially and belonging to the worm gear mechanism is coupled to the drive motor.

3. The feeding device as claimed in claim 2, wherein the motor axes are oriented tangentially with respect to the worm wheels, and wherein the spindle axes and the motor axes have different angular positions in relation to one another in the direction of rotation of the transport wheels.

4. The feeding device as claimed in claim 2, wherein the spindle axes are arranged one behind another in a plane at right angles to the plane of rotation of the transport wheels, wherein the motor axes are oriented parallel to one another and are arranged one above another in the projection at right angles to the plane of rotation of the transport wheels, wherein drive shafts of the drive motors are provided with drive pinions which engage in gears belonging to the drive spindles, and wherein the drive pinions are arranged in alternate sequence on opposite sides of the gears.

5. The feeding device as claimed in claim 1, wherein the feeding device includes three transport wheels which are parallel to one another and have a common axis of rotation, wherein the drive motors assigned to the two outer transport wheels are arranged at one height, wherein their motor axes run on one side of the gears, and wherein the drive motor assigned to the central transport wheel is arranged with its motor axis on the side of the gears opposite the other motor axes.

6. A feeding device adapted for taped electric components, comprising:
   a plurality of transport wheels, adapted to transport tape; and
   a plurality of drive motors, each coupled to and adapted to drive a transport wheel via a gear mechanism, wherein axes of rotation of the transport wheels are arranged coaxially and motor axes of the drive motors are oriented at right angles to the axes of rotation, wherein a distance in an axial direction of the transport wheels is smaller than a distance between the transport wheels, and wherein, in at least two of the drive motors, the motor axes are arranged to be offset in relation to each other in a projection at right angles to the plane of rotation of the transport wheels.

7. The feeding device as claimed in claim 6, wherein the gear mechanism is constructed as a worm gear mechanism, wherein a worm wheel of the worm gear mechanism is firmly connected to the transport wheel, and wherein a drive spindle fitted tangentially and belonging to the worm gear mechanism is coupled to the drive motor.

8. The feeding device as claimed in claim 7, wherein the motor axes are oriented tangentially with respect to the worm wheels, and wherein the spindle axes and the motor axes have different angular positions in relation to one another in the direction of rotation of the transport wheels.

9. The feeding device as claimed in claim 7, wherein the spindle axes are arranged one behind another in a plane at right angles to the plane of rotation of the transport wheels, wherein the motor axes are oriented parallel to one another and are arranged one above another in the projection at right angles to the plane of rotation of the transport wheels, wherein drive shafts of the drive motors are provided with drive pinions which engage in gears belonging to the drive spindles, and wherein the drive pinions are arranged in alternate sequence on opposite sides of the gears.

10. The feeding device as claimed in claim 6, wherein the feeding device includes three transport wheels which are parallel to one another and have a common axis of rotation, wherein the drive motors assigned to the two outer transport wheels are arranged at one height, wherein their motor axes run on one side of the gears, and wherein the drive motor assigned to the central transport wheel is arranged with its motor axis on the side of the gears opposite the other motor axes.

11. The feeding device as claimed in claim 1, wherein the feeding device includes at least three transport wheels and at least three drive motors, wherein at least one of the three transport wheels is between at least two other transport wheels.

12. The feeding device as claimed in claim 1, wherein each transport wheel is adapted to transport a separate tape, each tape including electric components.

13. The feeding device as claimed in claim 1, wherein each transport wheel is adapted to transport a separate tape including electric components and wherein a cycle rate of each tape is matched to a cycle rate of each corresponding transport wheel to enhance performance of the feeding device.

14. The feeding device as claimed in claim 6, wherein the feeding device includes at least three transport wheels and at least three drive motors, wherein at least one of the three transport wheels is between at least two other transport wheels.

15. The feeding device as claimed in claim 6, wherein each transport wheel is adapted to transport a separate tape, each tape including electric components.

16. The feeding device as claimed in claim 6, wherein each transport wheel is adapted to transport a separate tape including electric components and wherein a cycle rate of each tape is matched to a cycle rate of each corresponding transport wheel to enhance performance of the feeding device.

* * * * *